United States Patent [19]
Rush et al.

[11] Patent Number: 5,193,969
[45] Date of Patent: Mar. 16, 1993

[54] WAFER TRANSFER MACHINE

[75] Inventors: John M. Rush, Mountain View; Torben Ulander, Sunnyvale; Michael T. Verdon, San Jose, all of Calif.

[73] Assignee: Fortrend Engineering Corporation, Sunnyvale, Calif.

[21] Appl. No.: 703,011

[22] Filed: May 20, 1991

[51] Int. Cl.$^5$ ............................................. B65G 65/04
[52] U.S. Cl. ............................. 414/404; 414/DIG. 4; 414/417; 118/500; 901/47
[58] Field of Search ............... 414/416, 417, 403, 404, 414/222, 217, 405, 786, DIG. 1, DIG. 3, DIG. 4; 118/500, 728; 901/719, 47; 204/298.23, 298.26, 298.28

[56] References Cited
U.S. PATENT DOCUMENTS

| | | | |
|---|---|---|---|
| 4,466,766 | 8/1984 | Geren et al. | 414/404 |
| 4,568,234 | 2/1986 | Lee et al. | 414/417 X |
| 4,776,744 | 10/1988 | Stonestreet et al. | 414/417 X |
| 4,795,299 | 1/1989 | Boys et al. | 414/417 X |
| 4,806,057 | 2/1989 | Coy et al. | 414/417 X |
| 4,856,957 | 8/1989 | Lau et al. | 414/417 X |
| 4,947,784 | 8/1990 | Nishi | 414/417 X |
| 4,987,407 | 1/1991 | Lee | 414/404 X |
| 5,054,988 | 10/1991 | Shiraiwa | 414/417 X |

Primary Examiner—Frank E. Werner
Attorney, Agent, or Firm—Keith Kline

[57] ABSTRACT

The present invention is a rotary, 3-stage wafer transfer machine. The transfer machine utilizes a pneumatically powered lift mechanism to raise wafers from a boat to a retaining area. If the next operation for the wafer is a single density operation (twenty-five wafers per boat), the wafers are the simply transferred to another boat for further processing. If the next operation for the wafers requires double density (fifty wafers per boat), a second set of wafers is lifted to the retaining area, where they are interspersed with the first set to create a double density set of fifth wafers. This set is then transferred to the appropriate boat (generally a quartz boat) for further processing. All components that could generate particulate contamination are sealed off from the transfer area. Extra duty materials are used for the components of the machine to provide unique reproducibility and eliminate much of the required maintenance as compared to the prior art. Lack of contamination and superior reproducibility allow increased yield in the manufacturing process.

9 Claims, 7 Drawing Sheets

WAFER TRANSFER MACHINE

FIELD OF THE INVENTION

This application is for a patent on a new type of wafer transfer machine used in the fabrication of integrated circuit chips.

BACKGROUND OF THE INVENTION

In the manufacture of integrated circuits, various processes are required to be performed on the silicon wafer that is the substrate of the chips. During manufacture, the wafer is transformed from a circular substrate of silicon to a finished wafer containing multiple chips. On of the elements of this manufacturing process is the transfer of the wafers between various carriers, termed boats, so that different operations may be performed on the wafers.

The wafer transfer operation is one of the factors that significantly affects chip yield. Therefore, a great deal of effort has been expended to improve the methods of wafer transfer.

Wafers are generally transported in a side-by-side, vertical orientation. One of the disadvantages of the prior art is that there is generally a fairly large variance in the repeatability of the transfer motion. That is, the machine performing the transfer will at first move the wafers to the proper position, but after some repetitions, will fall out of adjustment. When the tolerance of a given operation is exceeded, the wafers are brought into contact with a foreign object. This unwanted contact can damage chips, and lower the yield of the process.

Another problem inherent with some of the prior art machines is that moving parts can create particulate contamination. Wafer fabrication is performed in a "clean room" environment. Thus, any factor that generates contamination is a detrimental factor to yield.

Still another problem in the prior art is the maintenance of spacing between the individual wafers in a boat. If the spacing is not maintained, the wafers will contact each other, and again reduce yield.

SUMMARY OF THE INVENTION

The present invention is a rotary, multi-stage wafer transfer machine. The transfer machine utilizes a pneumatically powered lift mechanism to raise wafers from a boat to a retaining area. If the next operation for the wafer is a single density operation (twenty-five wafers per boat), the wafers are then simply transferred to another boat for further processing.

If the next operation for the wafers requires double density (fifty wafers per boat), a second set of wafers is lifted to the retaining area, where they are interspersed with the first set to create a double density set of fifty wafers. This set is then transferred to the appropriate boat (generally a quartz boat) for further processing.

The wafer transfer machine includes a unique six inch greaseless bearing in the lift mechanism. An advantage of the present invention is that the bearing and driving mechanisms of the machine are shielded from the wafers to reduce the possibility of particulate contamination.

Another advantage of the present invention is that its unique construction provides repeatability superior to that of all the prior art devices. In particular, the six inch bearing coupled with heavy metal plate components eliminates any "play" in the moving parts of the machine. This greater repeatability means that fewer wafers will be damaged by physical contact during transfer operations. The lift mechanism also includes failsafe devices which eliminate dropping or crushing of the wafers in a lost power situation, to further reduce loss due to breakage.

Another major advantage of the present invention is that the rotary design gives the machine a much smaller footprint than that of prior art devices. Prior art devices which allow automatic wafer transfer utilize lateral transfer mechanisms, which inherently require more operating space. Single stage devices, while smaller, require manual boat interchanges.

Still another advantage of the present invention is that it utilizes optical interrupt sensors to sense the wafers. Interrupt sensors eliminate false reads that can occur with devices using reflection sensing methods, and the particulate contamination generated by air sensors.

These and other objects and advantages of the present invention will become apparent to those skilled in the art in view of the description of the best presently known mode of carrying out the invention as described herein and as illustrated in the drawings.

BEST MODE OF CARRYING OUT THE INVENTION

Figure 1:
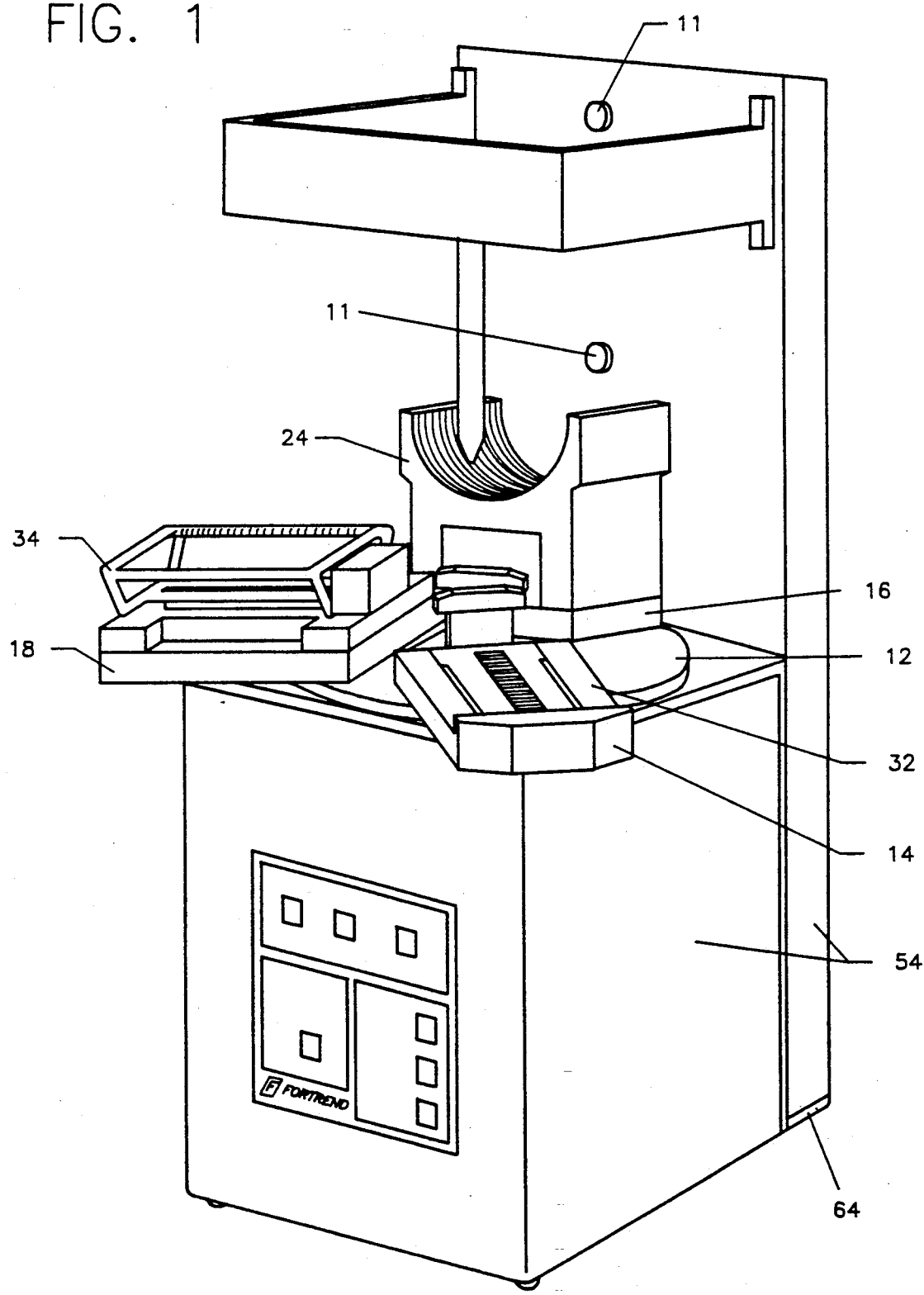
FIG. 1 is a perspective view of the automatic wafer transfer machine.

The present invention is a multi-stage, automated rotary wafer transfer machine 10, as shown in FIG. 1. The element which provides the rotating aspect of the transfer machine is a turntable 12. The turntable 12 includes three stages in the preferred embodiment; a first plastic boat stage 14, a second plastic boat stage 16, and a quartz boat stage 18. It is envisioned that other embodiments of the present invention will have a different number of stages. A two stage machine has been built and a four stage machine is planned.

By orienting the stages of the transfer machine in a circular fashion, a great deal of space is saved. The footprint of the present invention is only 9.56 in. × 14.50 in., roughly one-third of that in the prior art.

Figure 2:
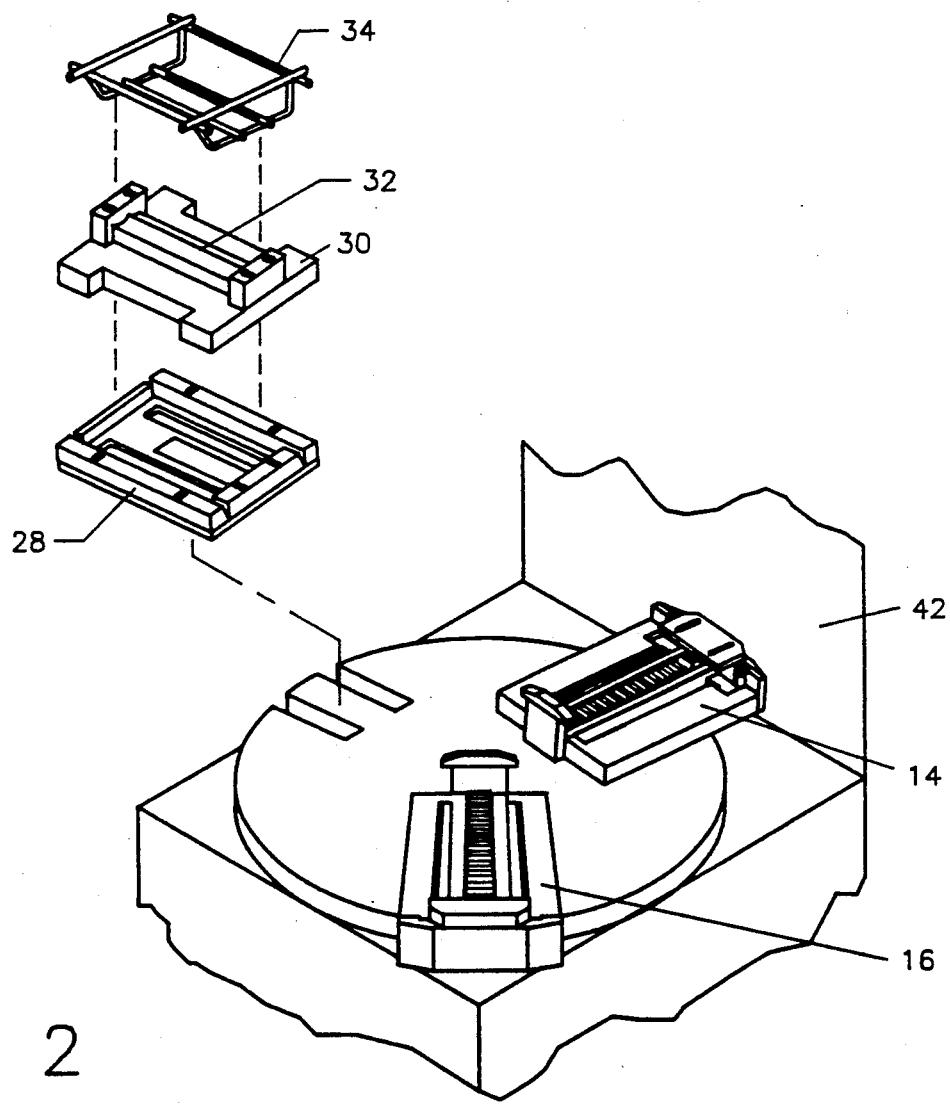
FIG. 2 is a perspective view of the three stage turntable with wafer boats.
Figure 3:
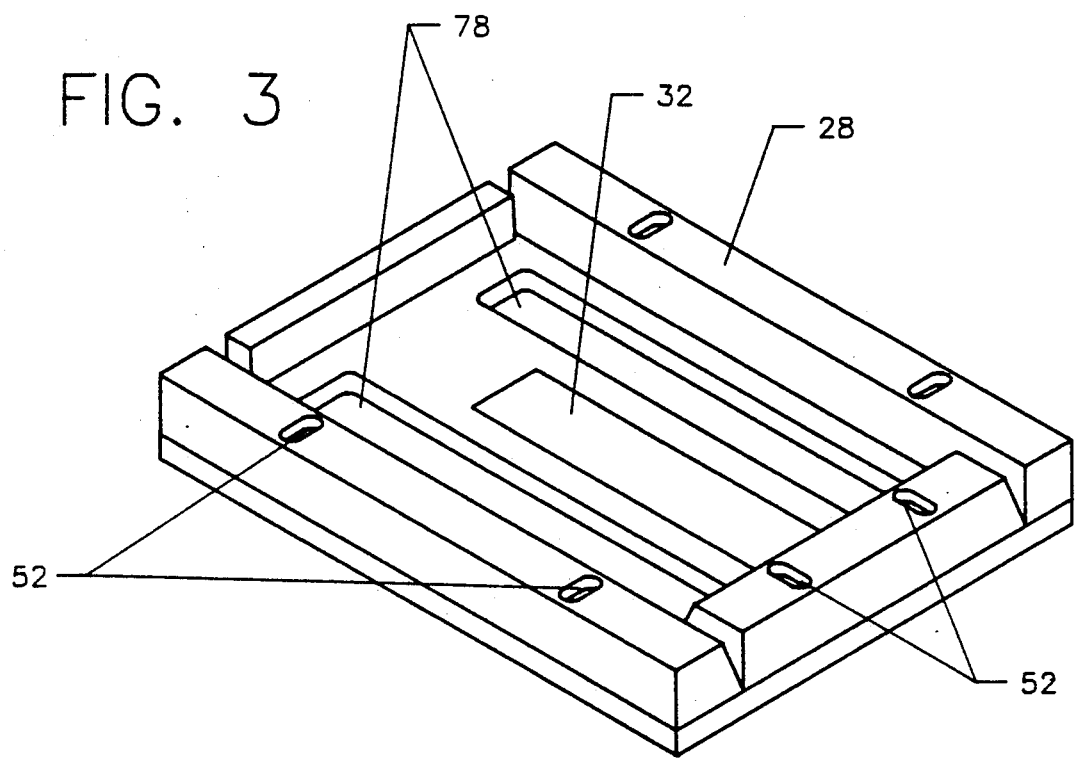
FIG. 3 is a perspective view of the quartz wafer boat stage base.
Figure 4:
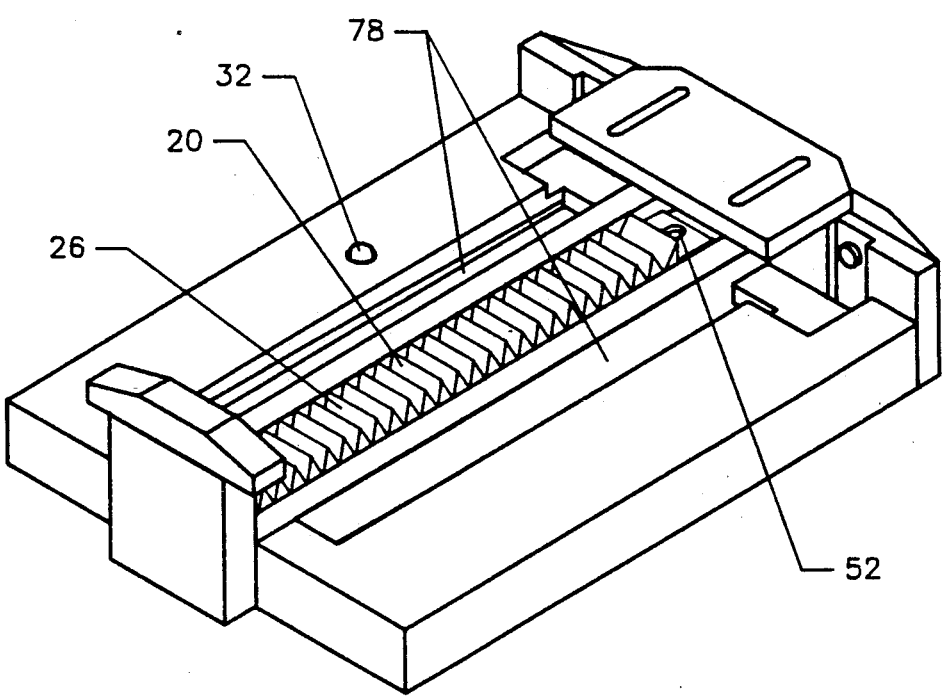
FIG. 4 is a perspective view of a standard wafer boat stage base.

The turntable 12 and the transfer stages 14, 16 and 18 are shown in greater detail in FIGS. 2, 3 and 4. The turntable 12 includes slotted apertures 78 at each of its stages to allow the elevator arms to pass through the turntable 12.

The two plastic transfer stages 14 and 16 each include a pre-alignment comb 20, a boat stop 22, and a detector means 32. The detector means 32, which is a standard photointerruptor, is used to determine the presence of a boat.

The boat stop 22 acts as a coarse alignment means to properly position a plastic wafer boat 24. As the boat 24 is placed in its position on a stage, the individual wafers settle into the V formed by the teeth 26 of the pre-alignment comb 20. Assuming the pre-alignment comb 20 has been properly set up the wafers will be in position to be transferred by the machine. (The setup procedure will be discussed in further detail below.)

The third position on the turntable 12 is occupied by a quartz boat stage 18. The quartz boat stage 18 includes a stage base 28, a boat frame 30, and detector means 32. The detector means 32 signals the presence of a quartz boat 34. A quartz boat will generally only be present if the operation following the wafer transfer is a double density, generally oxidizing operations requiring the use of a furnace. (The transfer operations will also be discussed in further detail below, following the description of the setup procedure.)

Figure 5:
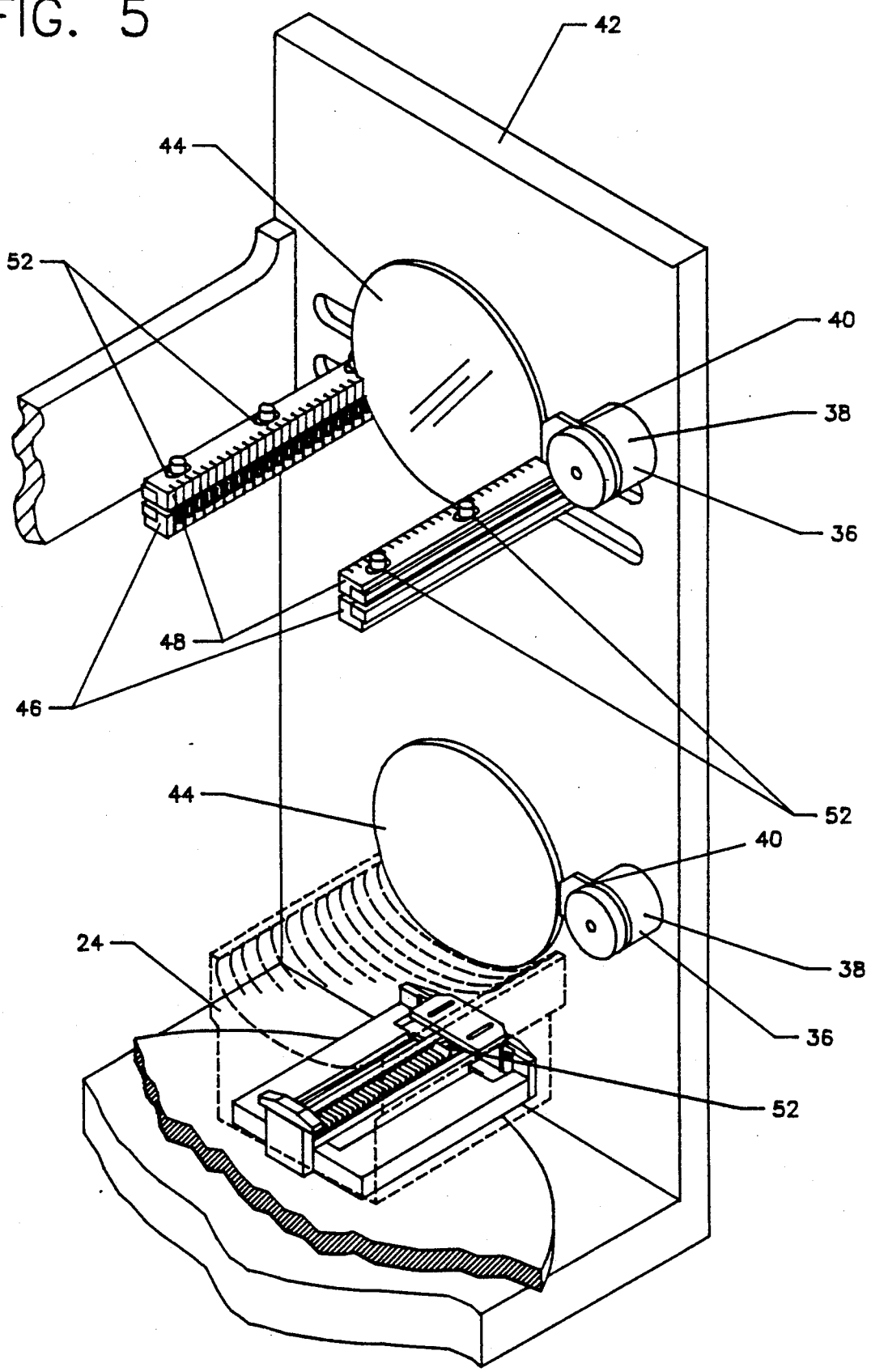
FIG. 5 illustrates use of the alignment tool to setup the retaining combs and stages.

Setup of the machine 10 is accomplished using alignment tools 36. The alignment tool 36 includes a machined stainless steel cylinder 38 and a blade 40. As illustrated in FIG. 5, the cylinder 38 of the tool 36 is placed against the bulkhead 42 of the machine when the retainer combs are being set up. A wafer 44 is placed in the nearest slot of the lower retainer combs 46 and the upper retainer combs 48. If the blade 40 of the tool 36 does not exactly align with the groove in the retainers, the position is adjusted.

This is accomplished by loosening set screws which are used to affix the retainer combs 46 and 48 to the retainer carriage in slotted holes 52. When the proper alignment is achieved, the set screws are tightened, fixing the combs in their appropriate position.

Alignment of the stages 14, 16 and 18 is accomplished in similar fashion. The alignment tool 36 is positioned on the lower portion of the bulkhead 42, so that the blade may be positioned in the first groove, that nearest the bulkhead 42, of the pre-alignment comb 20. The pre-alignment combs 20 are adjustably attached to the plastic boat stages 14 and 16.

Alignment of the plastic boat 24 in the stage 14 and 16 must also be checked and adjusted. To do this a wafer is simply put in the first position of the boat 24, and the alignment tool 36 is used to check its position. Adjustment is accomplished by means of the boat stops 22. Due to the flexibility of the setup procedure, most types of boats in use in the industry can be accommodated without alteration of the basic machine.

Note also that alignment of the comb 20 of the second stage 16 is offset 0.090 in. in comparison to the position of the first stage 14 in order to accommodate the meshing required for double density transfers. (The transfer procedure is described in detail below.) The offset is easily accomplished by modifying the tool 36 to include multiple anchor points for the blade 40 or by using multiple tools with varying sizes of the cylinder 38.

Alignment of the quartz boat stage 18 is similarly performed, with the adjustment being made to the position of the base 28, as opposed to the comb 20 of the other stages. As shown in FIG. 3, the adjustment means for the quartz boat stage 18 is by means of the slotted holes 52 in the stage base 28.

Alignment of the elevator combs (not shown in FIG. 5) is similarly accomplished by means of the alignment tool 36 and position adjustment.

Due to the unique construction of the present invention, it has been found that once a machine is properly set up in a user's facility, no further setup or adjustment is required during the life of the machine. This is due to the general design of the machine, the use of oversize bearings on the transfer elements, and the use of 5/16 in. metal plate for the structural members as opposed to ¼ in. or ⅛ in. in the prior art. The unparalleled lack of required maintenance is of great benefit to the user.

The wafer transfer machine 10 is for the most part pneumatically powered and electronically controlled. The powering mechanisms and electronic logic are well known in the art, and so are not described in detail here. Pneumatic power was chosen to avoid particulate generation as much as possible. Pneumatic power is used for all elements that raise and hold the wafers. The only exception to pneumatic power is the turntable 12, the driving mechanism for which is a stepper motor/gearing combination. In that the stepper motor drive mechanism is completely encased in a housing 54, (see FIG. 1), there is little chance of any foreign matter finding its way to the wafers.

To determine positions of elements of the machine and of the wafers, optical interrupt sensors (as in FIG. 1, element 11) were chosen. These devices were used to avoid the contamination problem associated with air sensors, and the false reads more common in reflection methods.

Figure 6:
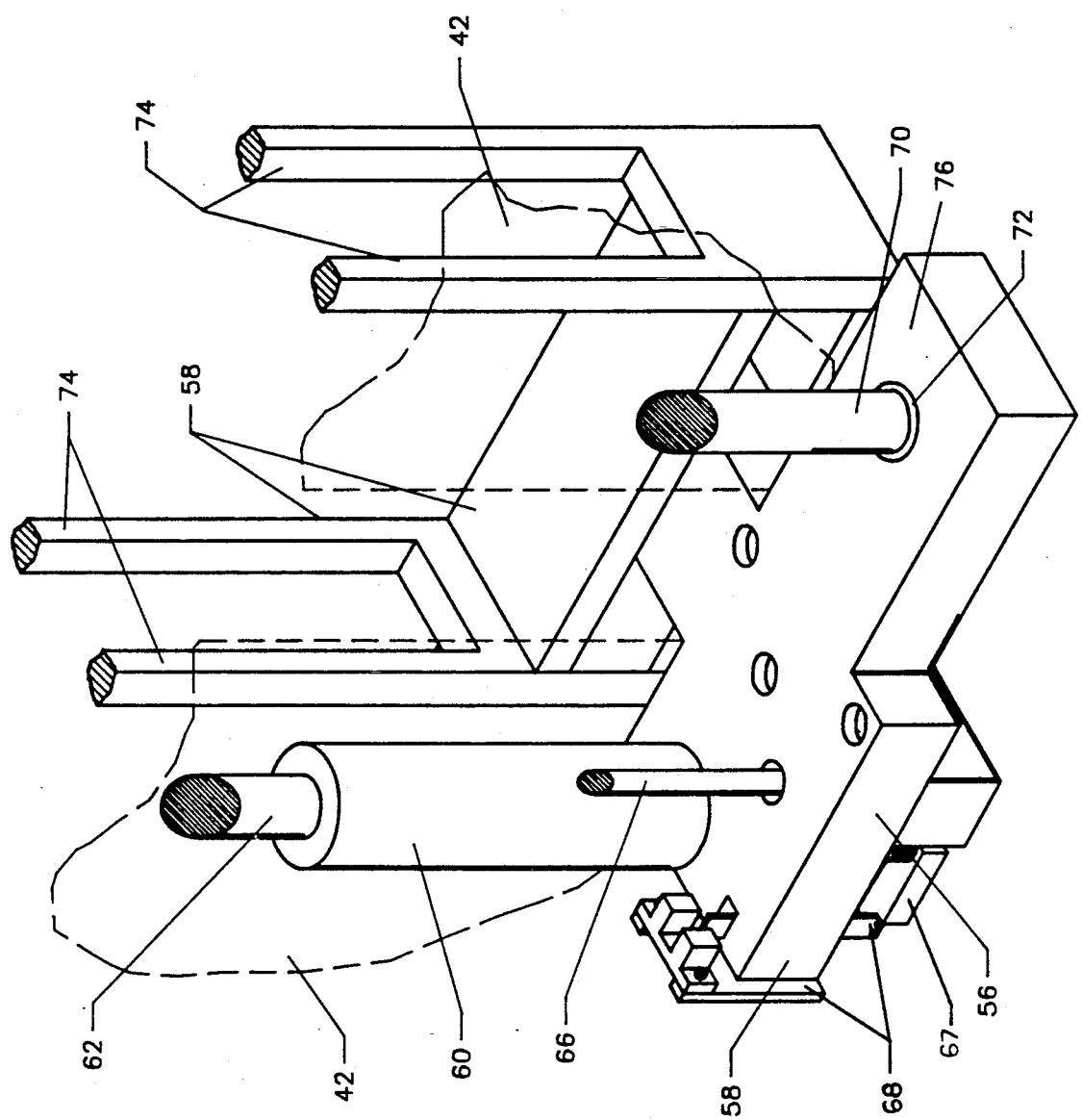
FIG. 6 shows the lower portion of the elevator assembly.

The mechanical operation of the transfer machine 10 may be described beginning with a base 56 of an elevator assembly 58 as shown in FIG. 6. When in the lowered position, the elevator base 56 is located behind the bulkhead 42 at floor (or workbench) level.

A key to the stability of the elevator assembly 58 is a greaseless bearing 60 that guides the elevator assembly 58 along a main guide shaft 62. The main guide shaft 62 is rigidly fixed at its lower end to a base 64 of the machine. The guide shaft 62 passes through the bearing 60, which is integral to the base 56 of the elevator assembly 58. The upper end of the main guide shaft 62 is rigidly affixed to the rear of the bulkhead 42.

The bearing 60 has a six inch span, far longer than those commonly used in the industry. The greater length of the bearing 60 provides the elevator assembly 58 far greater stability than in prior art devices. If a shorter bearing is used, the elevator assembly will develop "shimmy" as it travels along the elevator shaft. Any undesired motion in the travel path of the elevator assembly can lead to broken or damaged wafers, which of course reduces the usefulness of the machine.

The elevator assembly 58 is raised and lowered by a main cylinder driving shaft 66 which is affixed at its lower end to a driving shaft base 67, and slidably connected at its upper end to a main air cylinder (not shown). The main air cylinder, a standard pneumatic cylinder, supplies the power to drive the elevator assembly 58. The driving shaft base 67 is supplied with a spring loaded failsafe switch 68. If pressure greater than a predetermined limit is applied to the driving shaft 66, such as would occur if the elevator encountered an obstruction, the failsafe switch activates and stops the motion of the machine before wafers are destroyed.

To stabilize rotational forces while the elevator assembly 58 is in motion, a secondary guide shaft 70 is affixed at its lower end to the base 64 of the machine. The secondary guide shaft 70 passes through a small bearing 72 in the elevator base 56, and is affixed to the rear of the bulkhead 42 at its upper end.

When the wafer transfer operation is initiated, power is supplied to the elevator assembly 58 from the main air cylinder. The main cylinder driving shaft 66 is pulled up by the main air cylinder, raising the elevator assembly 58. This raises elevator arms 74 which are connected to the elevator base 56 by a rigid connecting member 76 which passes through the bulkhead 42.

As the arms 74 are raised, they pass through arm openings 78 in the subject stage 14, 16 or 18. (see FIGS. 3 and 4.) The turntable 12 has corresponding arm openings 78 to allow the arms 74 to pass through. (See FIGS. 5 and 7.) The arms 74 are aligned so that slots 80 in elevator combs 82 are coincident with the wafers 44 in the boat 24. As the arms rise through the stage holding the boat with the wafers to be transferred, the wafers 44 are picked up in the slots 80 as the elevator assembly 58 continues to rise.

The elevator assembly 58 lifts the wafers 44 until they are in position to be secured in the retaining area 84. (The construction and operation of the retaining mechanisms is described in greater detail below following the description of the double density transfer process.)

When the elevator 58 has lifted the wafers to the retaining area 84, the lower retainers 46 are activated, and move toward the center of the machine to their closed position. The elevator 58 then lowers, and the wafers 44 are secured in slots 90 in the retainer 46. The elevator 58 continues to lower until it is below the turntable 12.

To complete a single density transfer, the turntable 12 is rotated so that the receiving boat is in the proper position. The elevator 58 is again raised until it picks up the wafers 44 from the retaining area 84. The retainers 46 are moved to their open position, and the wafers 44 are then lowered into their proper boat, and the single density transfer is completed.

A double density transfer requires two sets of wafer in plastic boats being meshed together and placed into the quartz boat. When a double density transfer is desired, the following additional steps are required.

After the first set of wafers is secured in the lower retainer 46, and the elevator 58 lowered, the turntable 12 would rotate the second-plastic boat stage 16 to the elevator area. The elevator 58 would be activated and raise the second set of wafers to the retaining area.

These wafers would pass through the gaps 81 in the lower retainer 46. (Recall that the second stage 16 was set up so that the second set of wafers are slightly offset from the first set of wafers.) As it rises through the lower retainer 46, the elevator 58 picks up the first set of wafers, and the first retainer 46 is retracted. At this point, a double set of wafers is held on the elevator combs 82.

The upper retainer 48 is then activated so that it moves to the closed position. The elevator is lowered, passing through the upper retainer 48, with the result being that the double density set of wafers is now secured in the upper retainer 48.

The quartz boat stage 18 is then rotated to the elevator area, and the quartz boat base and frame 28 and 30 are raised to accept the double density set of wafers. Note that a shorter stroke is now required for the elevator 58 since the quartz boat 34 is being raised on top of the elevator. A stop switch mounted on the rear of the bulkhead is activated when the quartz boat 34 is being raised to accomplish the required shorter stroke. When the quartz boat 34 is lowered, the double density transfer is completed.

Figure 8:
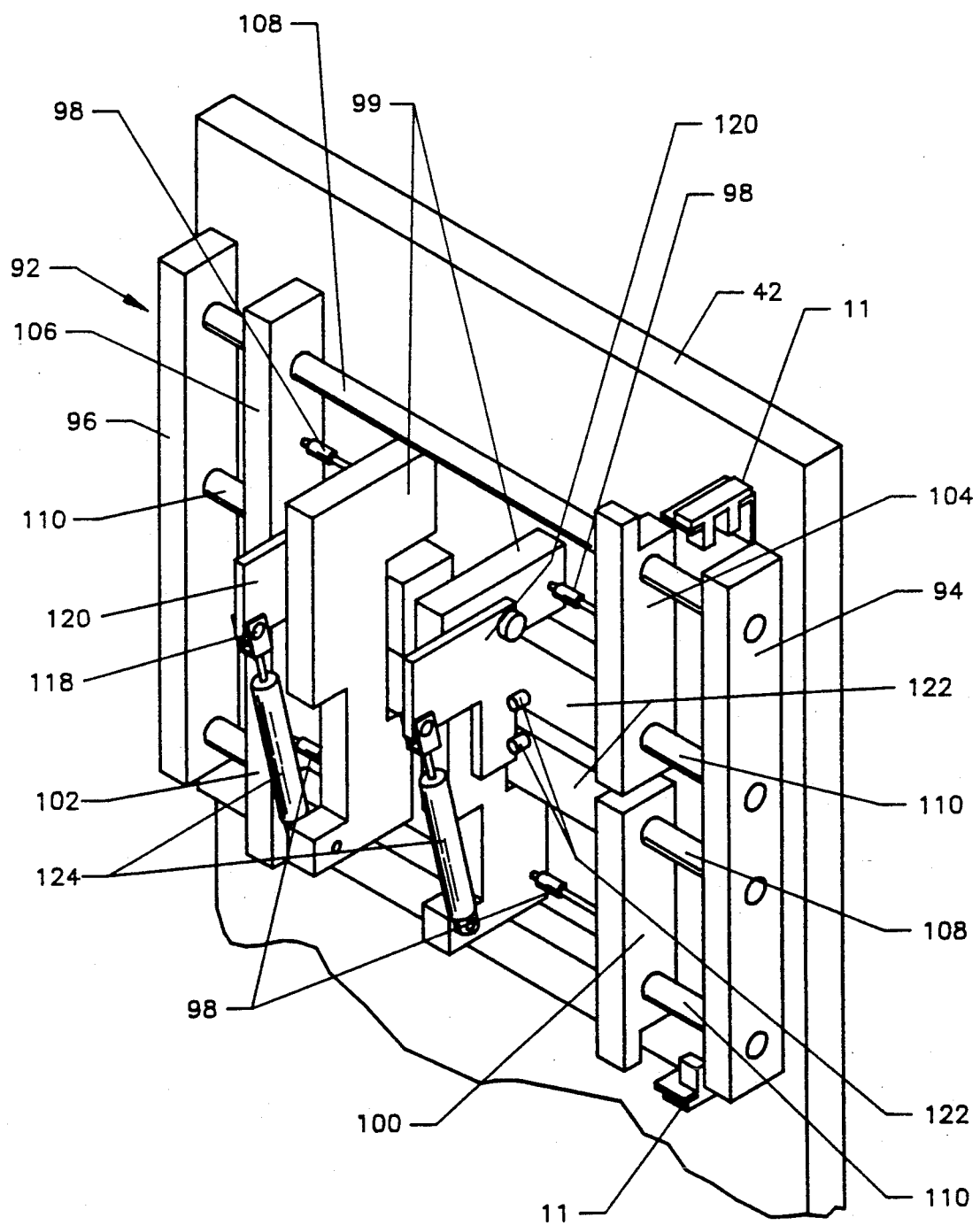
FIG. 8 is a rear view of the transfer machine showing the retainer carriage.

The construction and operation of the retainers 86 and 88 is similar to that of the elevator assembly 58, except that the retainers operate in the horizontal plane instead of the vertical. The construction of the driving elements of the retainers is shown in FIG. 8.

A retainer carriage 92 is affixed to the rear of the bulkhead 42. The carriage 92 includes a right mounting block 94 and a left mounting block 96. The carriage is powered by four secondary air cylinders 98 mounted on interior mounting blocks 99. The secondary cylinders 98 power each of the four retainer drives—right lower 100, left lower 102, right upper 104, and left upper 106. (For ease of description, the operation of only the right upper retainer drive 104 will be detailed. It should be recognized that the three remaining retainers—100, 102 and 106—operate in identical fashion.)

The drive 104 is slidably mounted on an upper guide shaft 108 and a lower guide shaft 110. Again, an oversized bearing 112 is used to provide stability and reproducibility of travel path. The bearing is integral to the drive 104.

When the upper retainer is activated, the air cylinder 98 pulls the drive 104 from its open position (shown) toward the center of the machine to its closed position.

Figure 7:
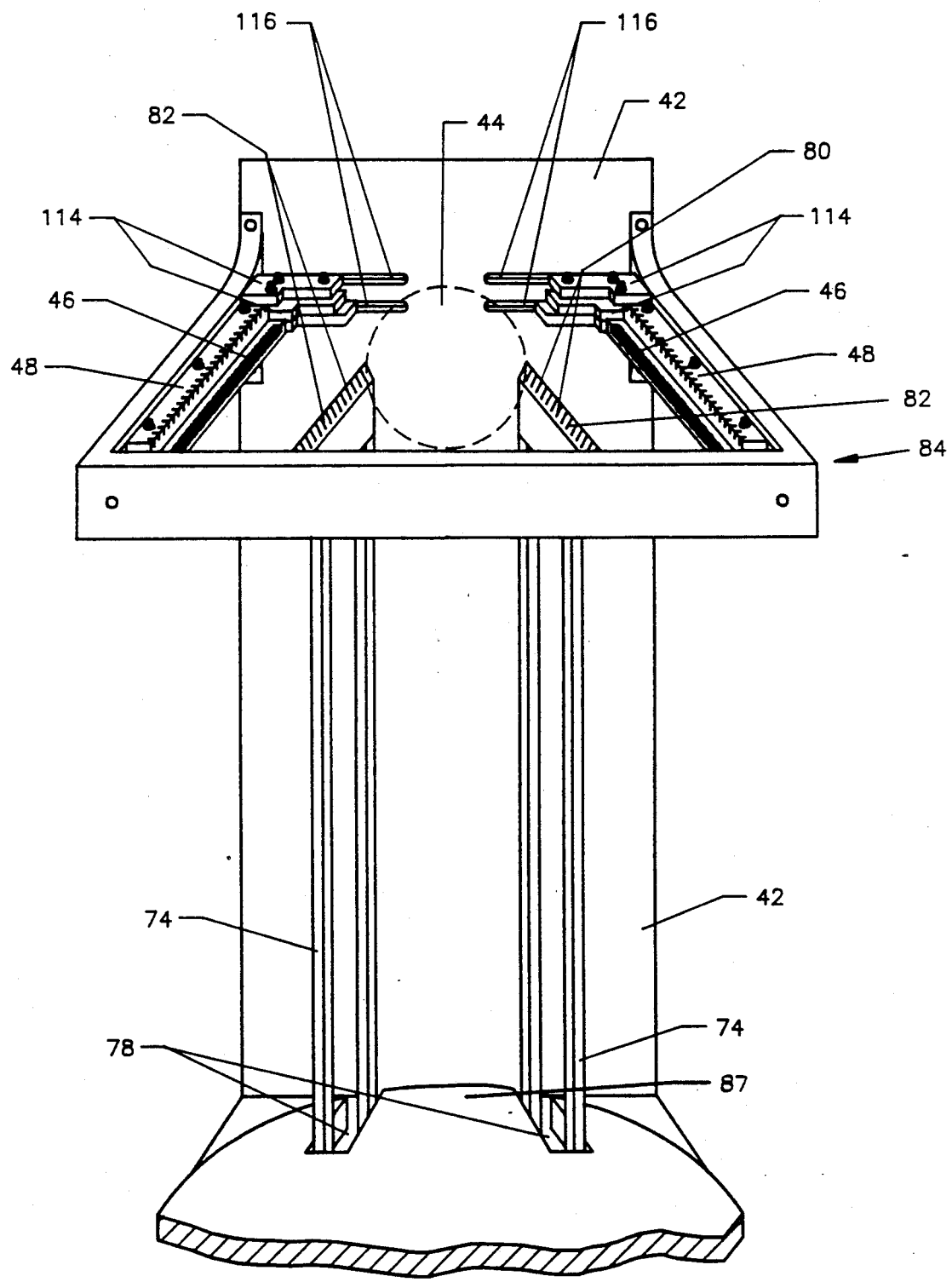
FIG. 7 is a perspective view of the upper and lower retaining combs and the elevator combs in the raised position.

Referring now to FIG. 7, retainer arms 114 are affixed to the retainer drives. The arms 114 extend from the drives through slotted apertures 116 in the bulkhead 42. The retainer combs 46 and 48 are in turn attached to the arms 114. Thus, when a retainer is activated, the arms 114 move inward to secure a set of wafers 44, or outward to release them.

An additional feature of the present invention is the failsafe mechanism 118, as shown in FIG. 8. The failsafe mechanism 118 includes a pair of rigid latches 120 pivotably mounted on the interior mounting blocks 99. The mechanism 118, shown in the activated position, abuts against stops 122 that protrude from each of the retainer drives 100-106. When power is available to the machine, failsafe air cylinders 124 raise the stops 116 so that the stops 122 on the drives 100-106 have a clear path, and the travel of the drive is not inhibited. If there is a power interruption, the latches 120 pivot to the position shown, and the drives are prevented from moving from the open to the closed position. This prevents crushing of wafers.

The above disclosure is not intended a limiting. Those skilled in the art will readily observe that numerous modifications and alterations of the device may be made while retaining the teachings of the invention. Accordingly, the above disclosure should be construed as limited only by the metes and bounds of the appended claims.

We claim:

1. A wafer transfer machine comprising:
   multiple stages for mass loading and unloading of wafers from boats in which the wafers are transported during processing, each stage including means to secure the boats and to align the wafers therein; and
   a rotary turntable driven by a stepper motor controlled by a control logic of the machine to successively transfer the stages to an elevator area of the machine;
   where elevator arms including elevator combs lift the wafers in mass from the boats to a retaining area where they are secured by retaining combs, the elevator arms then being lowered, the turntable rotating a stage with an empty receiving boat to the elevator area, the elevator arms being raised, the retaining combs being released, and the elevator being lowered so that the wafers are deposited in mass into the receiving boat.

2. The machine of claim 1 wherein:
the number of stages is three.

3. The machine of claim 1 wherein:
driving mechanisms of the turntable and the elevator arms are isolated from the wafers by metal bulkheads to avoid contamination of the wafers.

4. The machine of claim 1 wherein:
failsafe devices including physical blocking mechanisms which are activated in event of any power interruption are included as an integral part of the machine to avoid wafer breakage;
the blocking mechanism being mechanical stops which in an absence of power to the machine drop into a path of each of four retainer drives, prohibiting any movement of the elevator combs or retaining combs.

5. The machine of claim 1 wherein: optical interrupt sensors are positioned in the retaining area, the elevator area, and in the path of each of four retainer drives enabling a control logic of the machine to determine positions of the wafers and the drives, optical interrupt sensors being chosen to reduce contamination and false reads.

6. The machine of claim 1 wherein:
a bearing which is connected to the elevator arms and which moves along a main guide shaft is greatly oversized so that there is no variation in a linearity of the travel path of the bearing along the main guide shaft.

7. The machine of claim 1 wherein:
metal bulkheads and bases of sufficient thickness are utilized so that forces generated by operation of the machine do not change a position of bulkheads and bases, and therefor do not change a position of guide and support shafts affixed to the bulkheads and bases.

8. The machine of claim 1 wherein:
the retaining area includes two sets of retaining combs so that a double density transfer, i.e. two boats of twenty-five wafers being deposited into one boat of fifty wafers, may be accomplished.

9. The machine of claim 1 wherein:
the elevator arms and retaining combs are driven by pneumatic powering means.

* * * * *